(12) United States Patent
Zommer

(10) Patent No.: US 8,586,480 B1
(45) Date of Patent: Nov. 19, 2013

(54) POWER MOSFET HAVING SELECTIVELY SILVERED PADS FOR CLIP AND BOND WIRE ATTACH

(75) Inventor: Nathan Zommer, Fort Lauderdale, FL (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 13/563,703

(22) Filed: Jul. 31, 2012

(51) Int. Cl.
    *H01L 21/44* (2006.01)

(52) U.S. Cl.
    USPC ............ 438/686; 438/119; 438/654; 977/721

(58) Field of Classification Search
    USPC .................. 438/118, 119, 644, 654, 686, 688, 438/FOR. 348, FOR. 407; 977/721, 775, 977/777, 855
    See application file for complete search history.

(56) References Cited

U.S. PATENT DOCUMENTS

| | | | | |
|---|---|---|---|---|
| 7,528,491 | B2* | 5/2009 | Kirby et al. | 257/774 |
| 7,972,949 | B2* | 7/2011 | Suzuki | 438/551 |
| 8,129,001 | B2* | 3/2012 | Wang et al. | 427/532 |
| 8,536,049 | B2* | 9/2013 | Reddington et al. | 438/636 |
| 2008/0303161 | A1* | 12/2008 | Kobayashi et al. | 257/762 |
| 2011/0114914 | A1* | 5/2011 | Numata et al. | 257/9 |

* cited by examiner

*Primary Examiner* — S. V. Clark
(74) *Attorney, Agent, or Firm* — Imperium Patent Works; T. Lester Wallace

(57) ABSTRACT

A packaged power field effect transistor device includes a power field effect transistor die, a DBA substrate, a clip, a wire bond, leads, and an amount of plastic encapsulant. The top of the DBA has a plurality of metal plate islands. A sintered silver feature is disposed on one of the islands. A silvered backside of the die is directly bonded to the sintered silver structure of the DBA. The upper surface of the die includes a first aluminum pad (a source pad) and a second aluminum pad (a gate pad). A sintered silver structure is disposed on the first aluminum pad, but there is no sintered silver structure disposed on the second aluminum pad. A high current clip is attached via soft solder to the sintered silver structure on the first aluminum pad (the source pad). A bond wire is ultrasonically welded to the second aluminum pad (gate pad).

19 Claims, 8 Drawing Sheets

SINTERED SILVER ON A TOP-SIDE PAD FOR HIGH-CURRENT CLIP ATTACH

MANY WIRE BONDS REQUIRED TO HANDLE CURRENT

WAFER
(TOP-DOWN VIEW)

ONE DIE AREA ON THE WAFER
(CROSS-SECTIONAL VIEW)

APPLY SILVER NANOPARTICLE
PASTE TO ONE OF THE PADS
OF THE DIE AREA
(CROSS-SECTIONAL VIEW)

WAFER AFTER APPLICATION OF
SILVER NANOPARTICLE PASTE
(TOP-DOWN VIEW)

| CONSTITUENT | | WEIGHT PERCENT |
|---|---|---|
| SILVER NANOPARTICLES | SILVER<br>~ 8-12 nm DIAMETER<br>SINTER TEMP = 250°C w/ no pressure | 86% |
| DISPERSANT / BINDER | FATTY ACID SUCH AS STEARIC ACID<br>BURNOUT TEMP = 200°C | 2% |
| SOLVENT (THINNER) | TERPINEOL | 10% |
| FLUX | A SALT OF A FLUORINE-CONTAINING ACID SUCH AS HEXAFLUOROSILIC ACID | 2% |

CONSTITUENTS OF A SILVER NANOPARTICLE PASTE

FIG. 8

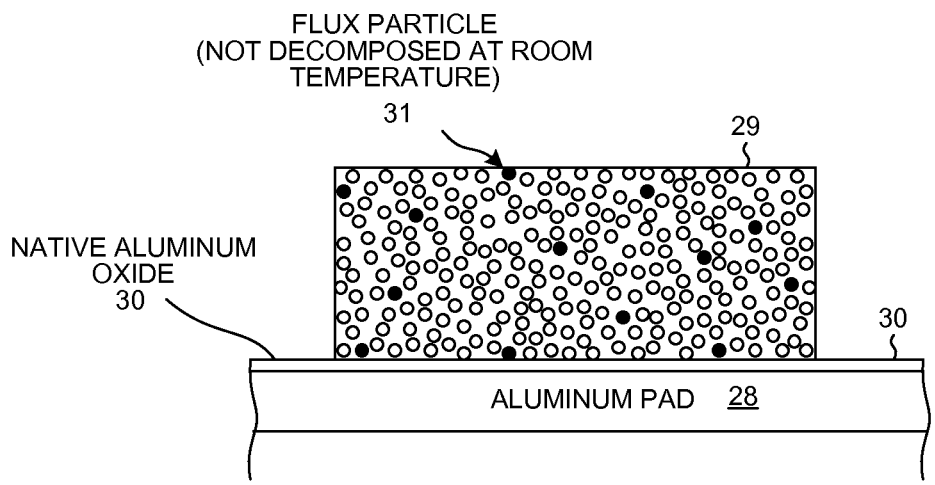

DETAIL OF SILVER NANOPARTICLE PASTE BEFORE SINTERING

FIG. 9

DETAIL OF THE SINTERING OPERATION

DETAIL OF THE RESULTING SILVER FEATURE AFTER SINTERING

ONE DIE AFTER SINTERING AND WAFER DICING

SINTERED SILVER ON A TOP-SIDE PAD FOR HIGH-CURRENT CLIP ATTACH

CROSS-SECTIONAL VIEW OF PACKAGED POWER FIELD EFFECT TRANSISTOR DEVICE

ANOTHER STYLE OF CLIP

POWER MOSFET HAVING SELECTIVELY SILVERED PADS FOR CLIP AND BOND WIRE ATTACH

TECHNICAL FIELD

The described embodiments relate to power field effect transistor devices.

BACKGROUND INFORMATION

FIG. 1 (Prior Art) is a simplified cross-sectional diagram of an old power bipolar transistor structure 1 that was used in the early days of bipolar transistors. The backside of the die is covered with a solderable metal. In the illustrated example, the backside surface of a wafer of devices is covered with a layer 2 of aluminum or titanium. A layer 3 of nickel is then formed over the aluminum or titanium to act as a barrier. A layer 4 of silver or gold is then formed by an evaporative deposition process onto the layer of nickel. Thereafter the wafer is diced so that each die has the layers of backside metal as illustrated in FIG. 1. The silver or gold layer 4 is then bonded to a substrate 5 of a package using an amount of soft solder 6. The backside metal structure forms the collector electrode of the bipolar device. An emitter electrode 7 and a base electrode 8 are disposed on the topside of the die. Each electrode involves an aluminum layer 9, which is covered by a titanium layer 10, which in turn is covered by a barrier layer of nickel 11, which in turn is covered by a silver layer 12. These layers are patterned and etched to form the emitter and base electrodes.

FIG. 2 (Prior Art) illustrates the topside emitter electrode 7 and the topside base electrode 8. A first post 15 and associated clip 16 provide an electrical contact and connection from the emitter electrode 7 to a conductor in the package. A second post 17 and associated clip 18 provide an electrical contact and connection from the base electrode 8 to another conductor in the package. The clips are attached to the silver on the top of die using amounts of soft solder 18.

With the advent of power field effect transistors, bond wires and wire bonding was used to make electrical connections between the gate and source pads on the die and associated conductors in the package. Clips were typically not used because the geometries of the pads on the die were too tight, and a clip may have shorted the pads together and caused other problems and failures. Currents were typically less than 50 amperes through a pad and were not as great as in the part power devices that were packaged in the manner illustrated in FIG. 1. A prior conventional thyristor, for example, may have been required to conduct 500 amperes through an electrode. Accordingly, due to the lower current requirements of the early field effect transistors, bond wires were adequate. Over the years since the advent of power field effect transistors, however, currents have steadily increased. To accommodate the increased currents, more and more bond wires have been provided to handle more and more current.

FIG. 3 (Prior Art) is a very simplified illustration intended to show that a great many bond wires 19 may be provided between the source electrode pad 20 of a power field effect transistor device 21 and its package. Fewer bond wires 22 may be provided for the lower current gate electrode pad 23, but there still may be multiple bond wires provided for this connection. It is now often common to have twenty or thirty bond wires attached to the source electrode pad in some high current power field effect transistor devices. Having this many bond wires on a single pad may introduce crowding problems and other assembly problems. The use of bond wires is nonetheless desirable due to the flexibility of how the connections can be made.

SUMMARY

A packaged power field effect transistor device includes a power field effect transistor die, a DBA (Direct Bonded Aluminum) substrate, a clip, a wire bond, and a plurality of leads. The die, the clip, the wire bond, and ends of the leads are overmolded with an amount of encapsulant. A top plate of the DBA within the package is patterned to form a plurality of metal plate islands. A sintered silver feature is disposed on one of the metal plate islands of the DBA. A silvered backside of the die is backside bonded in a silver-to-silver solderless die attach process to the sintered silver structure of the DBA.

The upper surface of the die includes a first aluminum pad (a source pad) and a second aluminum pad (a gate pad). A sintered silver structure is disposed on the first aluminum pad, but there is no sintered silver structure disposed on the second aluminum pad. A first end of the high current clip is attached to another metal island of the DBA. The other metal island in turn is coupled to a first lead of package. A second end of the clip is attached to the sintered silver structure on the first aluminum pad (the source pad) using an amount of soft softer. The second aluminum pad (the gate pad) is connected via a wire bond to a second lead of the package. The wire bond is attached to the second aluminum pad in conventional fashion using an ultrasonic wire bond welding process.

During manufacturing of the die, a wafer includes a plurality of regions that after wafer sectioning will become individual power field effect transistor dies. A source aluminum pad and a gate aluminum pad are disposed on the upper surface of each of these regions. In a microjetting process, individual amounts of silver nanoparticle paste are selectively deposed only onto the source pads such that no silver nanoparticle paste is deposited onto the gate pads. The entire wafer is microjetted in this way. The term "silver nanoparticle" is used in a general way here, and may describe sinterable pastes having larger particles of silver as long as the silver particles can be satisfactorily sintered together at low enough temperatures that the underlying field effect transistor is not damaged.

The wafer and the amounts of silver nanoparticle paste are then heated, thereby sintering the amounts of silver nanoparticle paste into individual sintered silver structures. As a result, each aluminum source pad is covered by its own separate sintered silver structure, but there are no sintered silver structures over the gate pads. The wafer is then diced to form the power field effect transistor dies that are then incorporated into the power field effect transistor device packages.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 8 is a table that sets forth the constituents of the silver nanoparticle paste applied in FIG. 6.

FIG. 9 is a cross-sectional side view of an amount of silver nanoparticle paste disposed on a source pad before sintering.

DETAILED DESCRIPTION

Reference will now be made in detail to some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front", "back", "top" and "bottom" are used herein to describe relative orientations between different parts of the structure being described, and it is to be understood that the overall structure being described can actually be oriented in any way in three-dimensional space.

Figure 1:
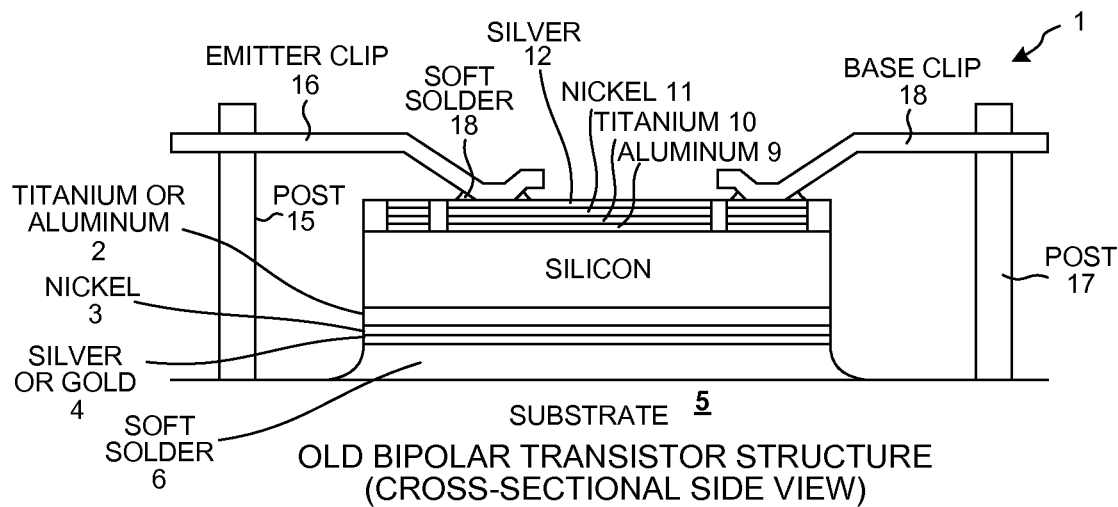
FIG. 1 (Prior Art) is a cross-sectional side view of a bipolar transistor structure used in the early days of power bipolar devices.
Figure 2:
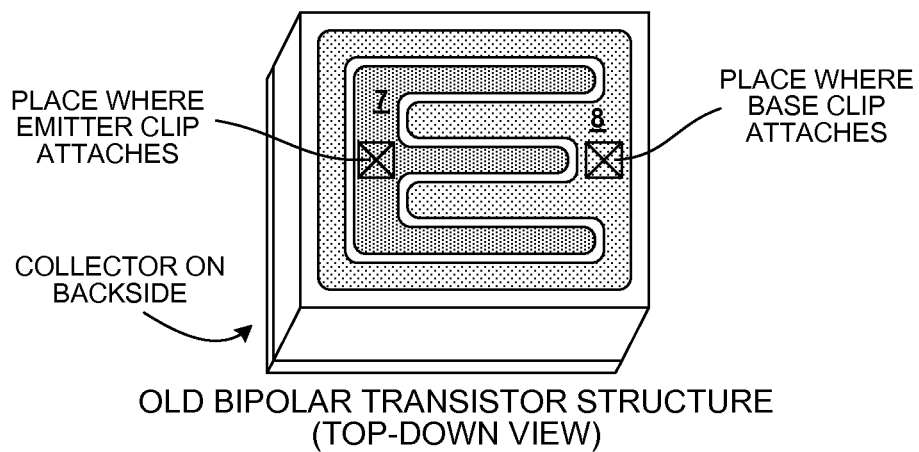
FIG. 2 (Prior Art) is a top-down perspective view of the old bipolar transistor structure of FIG. 1.
Figure 3:
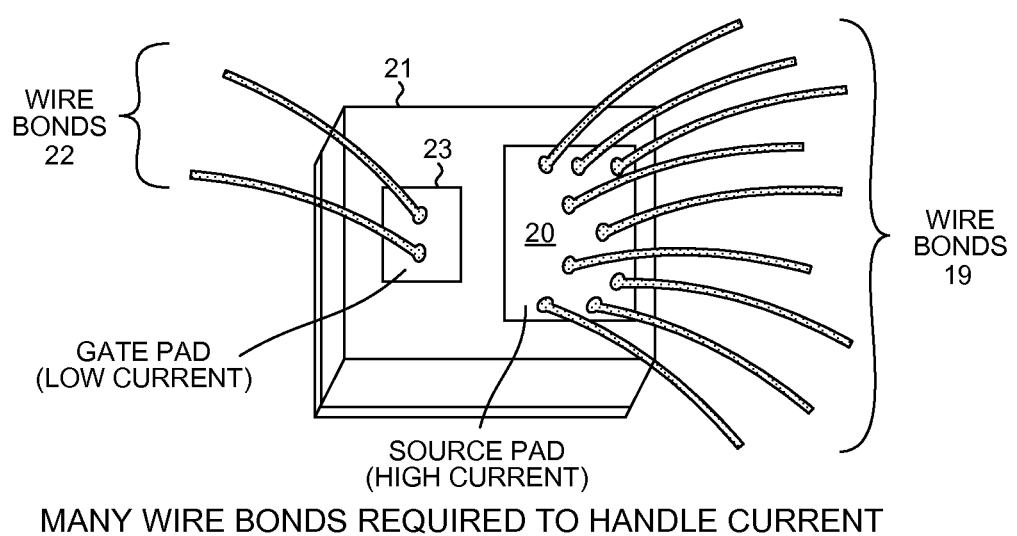
FIG. 3 (Prior Art) is a diagram that illustrates how a high current pad of a contemporary field effect transistor device may be required to have many wire bonds to carry the necessary current to/from the high current pad.
Figure 4:
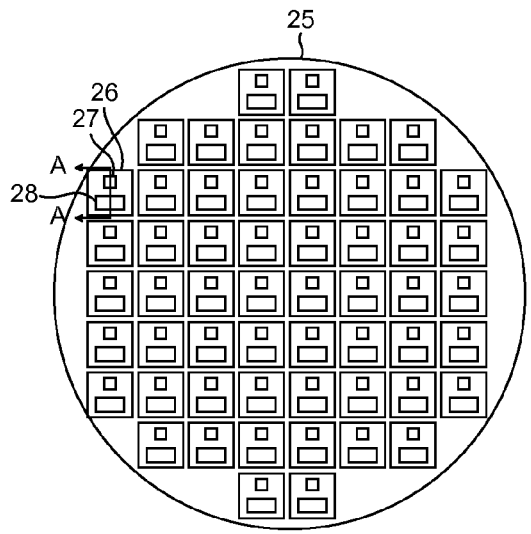
FIG. 4 is a top-down diagram of a wafer at one point in the manufacturing of a power field effect transistor die in accordance with one novel aspect.

FIG. 4 is a top-down diagram of a silicon wafer 25 of power field effect transistor devices. At the point in the fabrication process of the devices, all diffusion steps and the lower level metallization and interconnect steps have been performed. The square of wafer area that will form each power field effect transistor die has both a smaller square gate electrode pad and a larger rectangular source electrode pad. These pads are located on the upper surface of the wafer. For example, square die area 26 has a smaller gate electrode pad 27 and a larger source electrode pad 28. The entire backside of the wafer (not shown) is covered with backside metallization. After sectioning of the wafer into individual power field effect transistor devices, this backside metal will form the collector electrodes of the devices.

Figure 5:
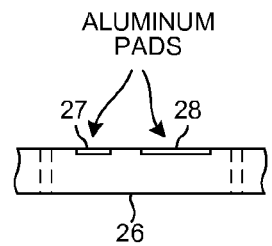
FIG. 5 is a simplified cross-sectional side view of a part of the wafer of FIG. 4.

FIG. 5 is a cross-sectional side view of a part of the wafer 25 of FIG. 4 taken along sectional line A-A in FIG. 4. The leftmost two vertical dashed lines indicate where the left edge of die 26 will be after wafer sectioning. The rightmost two vertical dashed lines indicate where the right edge of die 26 will be. The pads 27 and 28 at this point in the semiconductor fabrication process are aluminum pads. There is no other metal layer formed on or over the top of these aluminum pads. Due to the aluminum being in the presence of oxygen in the air, the aluminum material of each pad is covered by a thin native aluminum oxide layer.

Figure 6:
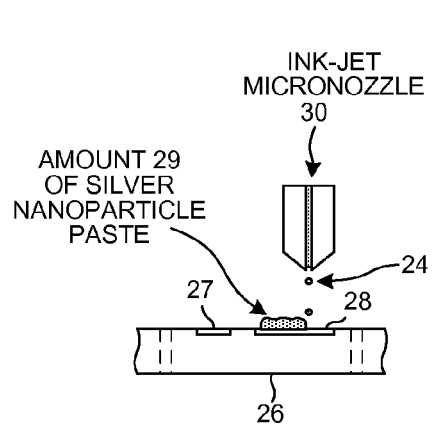
FIG. 6 is a view of the part of the wafer of FIG. 5 during the microjetting of an amount of silver nanoparticle paste onto a source pad.

FIG. 6 is a cross-sectional side view of a subsequent step in the semiconductor fabrication process. An amount 29 of silver nanoparticle paste is deposited onto the larger source electrode pad 28 using a micronozzle 30. Each larger source electrode pad of the wafer receives a corresponding similar amount of silver nanoparticle paste. No silver nanoparticle paste is deposited elsewhere on the wafer. There is no silver nanoparticle paste deposited onto any of the gate electrode pads. The ink-jet micronozzle is scanned back and forth across the wafer and the micronozzle is controlled to emit microdots 24 of the silver nanoparticle paste onto only selected parts of the wafer, the source electrode pads.

Figure 7:
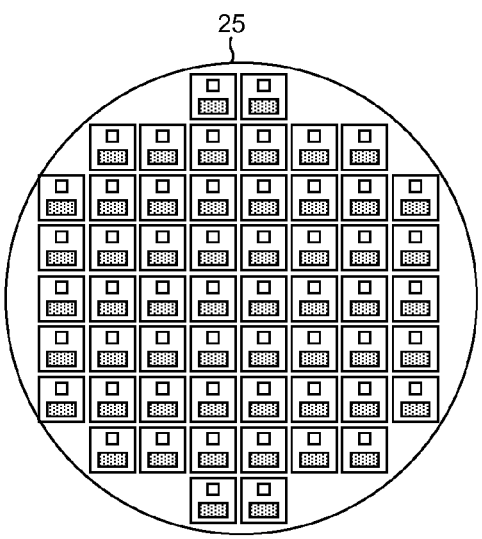
FIG. 7 is a top-down diagram of the wafer of FIG. 4 after all the source pads of the wafer have been covered with individual amounts of silver nanoparticle paste.

FIG. 7 is a top-down diagram of wafer 25 after the deposition of the amounts of silver nanoparticle paste.

FIG. 8 is a table that sets forth the constituents of the silver nanoparticle paste. The listed weight percentages and temperatures are approximate. The constituents set forth in the table are only for one suitable silver nanoparticle paste that can be used. Other silver nanoparticle pastes can be used and are commercially available from numerous manufacturers. For additional information on suitable silver nanoparticle pastes, and on the silver nanoparticle paste of FIG. 8 in particular, and on how to deposit and sinter the paste, see: U.S. patent application Ser. No. 13/490,459, entitled "Solderless Die Attach To A Direct Bonded Aluminum Substrate, filed Jun. 7, 2012, by Nathan Zommer (the entire subject matter of which is incorporated herein by reference).

FIG. 9 is a cross-sectional side view diagram of amount 29 of the silver nanoparticle paste of FIG. 6 after it has been microjetted onto pad 28 and before sintering. The hollow circle symbols in FIG. 9 represent particles of silver. Each silver nanoparticle is coated with the dispersant/binder. The dispersant/binder and the thinner of the paste serve to keep the silver particles evenly dispersed in the paste volume. The diagram is not to scale but rather is schematically shown to better illustrate the sintering process. Layer 30 is a thin layer of native aluminum oxide. The dark dots, of which dark dot 31 is one, are particles of flux in the present example where the silver nanoparticle paste of FIG. 8 is employed.

Figure 10:
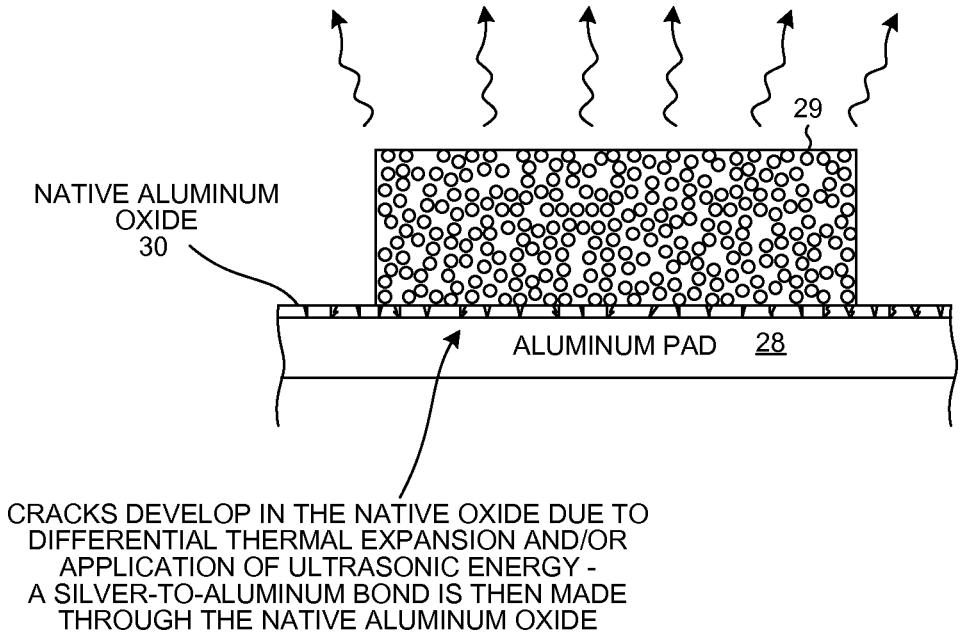
FIG. 10 is a cross-sectional side view of the silver nanoparticle paste of FIG. 9 part way through the sintering process.

FIG. 10 is a cross-sectional side view that illustrates the amount 29 of paste midway through the sintering process. As the temperature increases to about 150° C., the thinner evaporates. This results in a somewhat more dense packing of the nanoparticles as illustrated. Once the thinner has evaporated, the temperature is increased further to approximately 200° C. The type of dispersant/binder is selected so that the dispersant/binder coating separates from the silver particles and burns out at this 200° C. elevated temperature, but before actual sintering takes place at a higher sintering temperature of 250° C. Generally the dispersant and the binder involve organic molecules involving carbon chains of twelve or more carbon atoms, whereas the thinner is an organic molecule that has carbon chains of approximately three carbon atoms. Before burning off, these and/or other constituents of the paste may decompose to form reactive compounds and acids.

These reactive compounds and acids assist in penetrating, cleaning and/or removing oxides from the surface upon which the paste is disposed.

After burn out of the organic compounds, the temperature is increased to the higher sintering temperature of 250° C. The sintering 250° C. temperature causes the silver nanoparticles to densify and to sinter together. The sintering temperature depends on the size of the nanoparticles and the compaction pressure applied during sintering. In the present example, no compaction pressure is applied.

Figure 11:
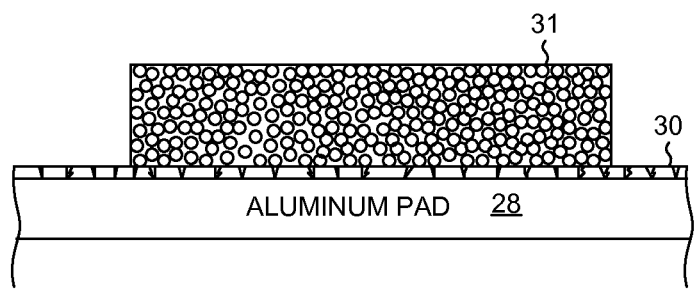
FIG. 11 is a cross-sectional side view of the silver nanoparticle paste of FIG. 9 after sintering has been completed.

FIG. 11 is a cross-sectional side view of a resulting sintered silver structure 31. There is good electrical contact between the resulting sintered silver structure 31 and the unoxidized aluminum of the underlying aluminum pad 28. This electrical connection exists through native oxide layer 30. The sintered silver structure 31 is also mechanically bonded to the pad. The precise manner of mechanical bonding is not fully understood, but it is believed that some of the small silver nanoparticles in their presintered state fit down into small cracks and imperfections in aluminum 28. These embedded particles are then sintered in place so that they are bonded to one another and to other nanoparticles of the larger sintered feature above. Due to these sintered extensions that are anchored into the cracks in aluminum 28, the resulting monolithic sintered structure 31 grasps and is bonded to aluminum pad 28. After the sintering process, the wafer is sectioned into individual power field effect device dice.

Figure 12:
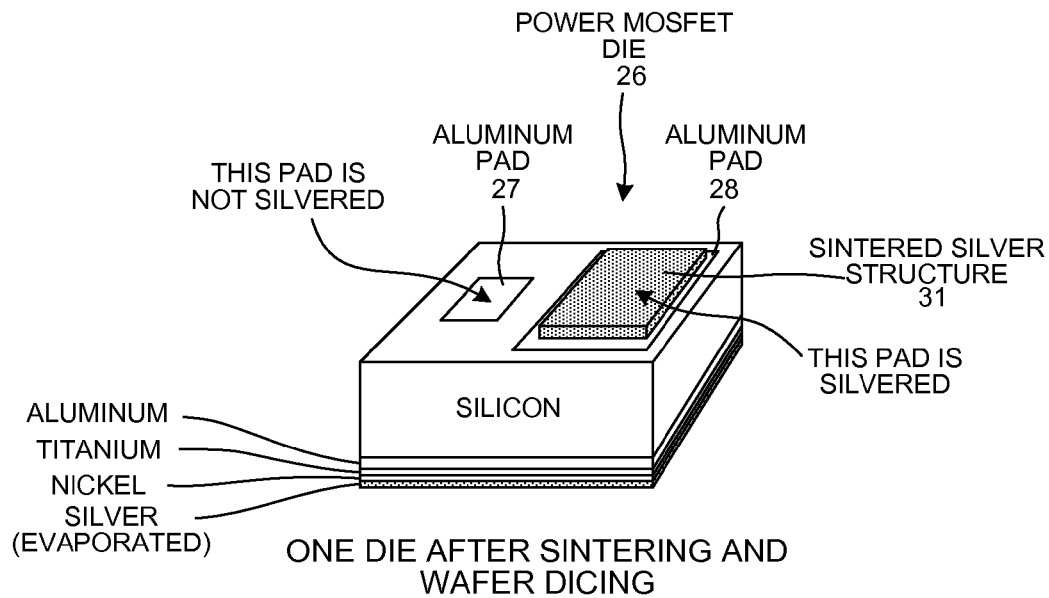
FIG. 12 is a simplified perspective view of a power field effect transistor die, where a sintered silver structure is disposed on the source pad of the die, but where no sintered silver structure is disposed on the gate pad of the die.

FIG. 12 is a perspective view of one of the power field effect transistor dies 26. Sintered silver structure 31 is disposed on the source electrode pad 28. There is no sintered silver feature disposed on or over gate electrode pad 27. At this point in the process, gate electrode pad 27 is aluminum, and is covered by a thin layer of native aluminum oxide.

Figure 13:
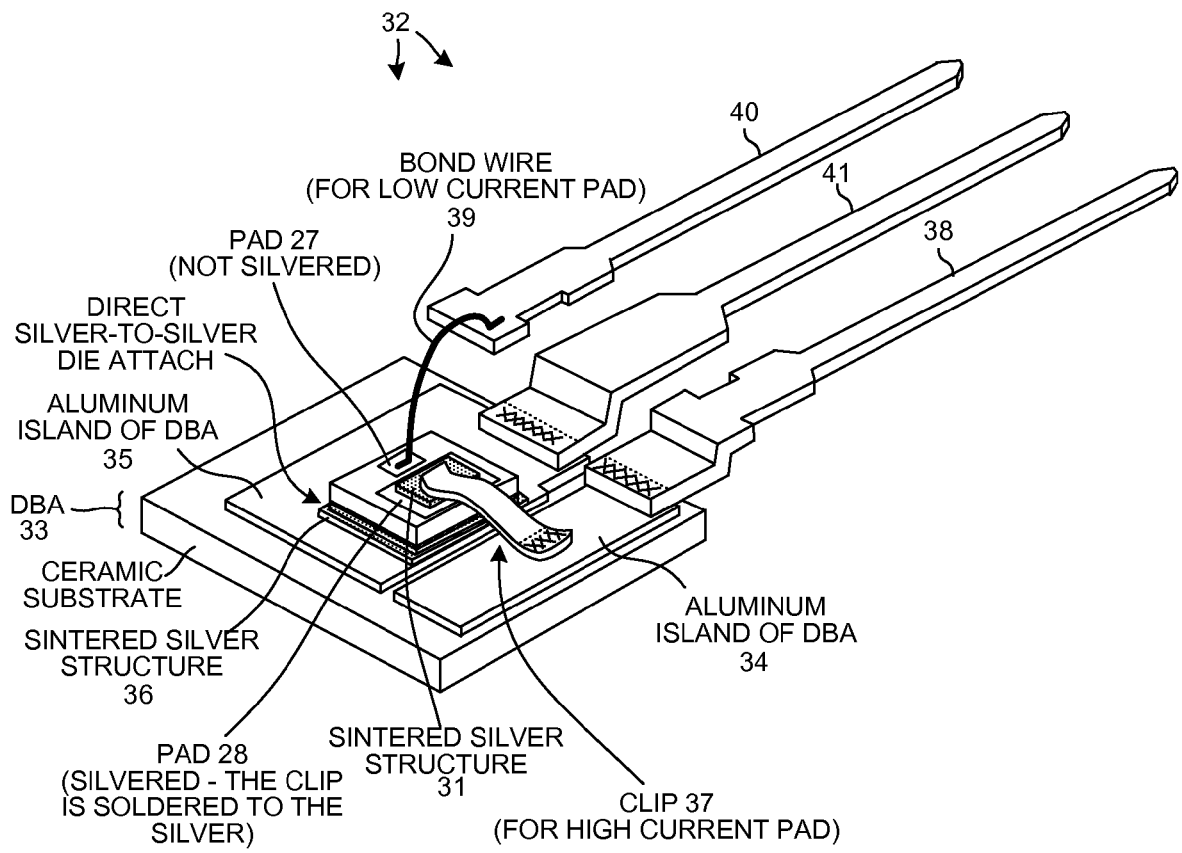
FIG. 13 is a simplified perspective view of a packaged power field effect transistor device that includes the die of FIG. 12.

FIG. 13 shows how the die 26 is then incorporated into a packaged power field effect transistor device 32. The injection molded encapsulant of the packaged device 32 is not shown in the illustration of FIG. 13.

A DBA (Direct Bonded Aluminum) substrate structure 33 is manufactured by pressing aluminum plates onto the front and back of a thin ceramic panel under adequate pressure and temperature. The ceramic panel may, for example, be 5.6 inches wide by 7.7 inches long, and may be 0.63 mm thick. Each of the aluminum plates may be 0.30 mm thick. After attachment of the aluminum plates to the ceramic substrate panel, the aluminum plates are patterned and etched to form individual aluminum islands. Separate amounts of silver nanoparticle paste are formed by microjetting microdots of paste onto the panel in selected places in order to form silver die attach structures that will later receive the dice. The DBA panel assembly is then sintered so that the volumes of silver nanoparticle paste are sintered to form individual silver die attach structures. The DBA panel assembly is then cut into sections to form individual DBAs. One such DBA 33 is illustrated in FIG. 13. The top aluminum plate has been patterned and etched to form two aluminum islands 34 and 35. Reference numeral 31 identifies one of the silver die attach structures.

Next, a row of such DBAs is attached to a leadframe. The ends of the leads of the leadframe may, for example, be ultrasonically bonded to the DBAs. After ultrasonic bonding of the DBAs to the leadframe, the silvered backsides of dies are direct silver-to-silver die attached to corresponding ones of the silver die attach structures of the DBAs. In this way, one die is attached to each DBA without the use of any soft solder.

Next, for each die, a high current clip is provided to electrically connect the sintered silver structure on the source electrode pad to an appropriate one of the leads of the leadframe. Reference numeral 37 identifies one such clip in the illustration of FIG. 13. The connection from this lip 37 to lead 38 is made via one of the aluminum islands 34. In the illustration of FIG. 13, a first end of clip 37 is ultrasonically attached to aluminum island 34. A second end of clip 37 is soft soldered to sintered silver structure 31 on the source electrode pad 28. Each of the dies of the leadframe assembly is provided for clips in this fashion.

The gate electrode pads of the dies have no silver structures on them. Each of these aluminum pads is provided with a wire bond, thereby attaching the non-silvered gate pad to an appropriate one of the leads. In the illustration of FIG. 13, a first end of wire bond 39 is ultrasonically wire bonded to aluminum gate pad 27. A second end of wire bond 39 is ultrasonically wire bonded to an end of lead 40. As explained above, the backside of the die is connected via silver-to-silver die attach to aluminum island 35 and to lead 41.

After clip attachment and wire bonding, an amount of resin encapsulant 42 (see FIG. 14) is injection molded over each die of the leadframe assembly in conventional fashion. The leadframe assembly is then lead formed and lead trimmed, thereby forming individual packaged power field effect transistor devices.

Figure 14:
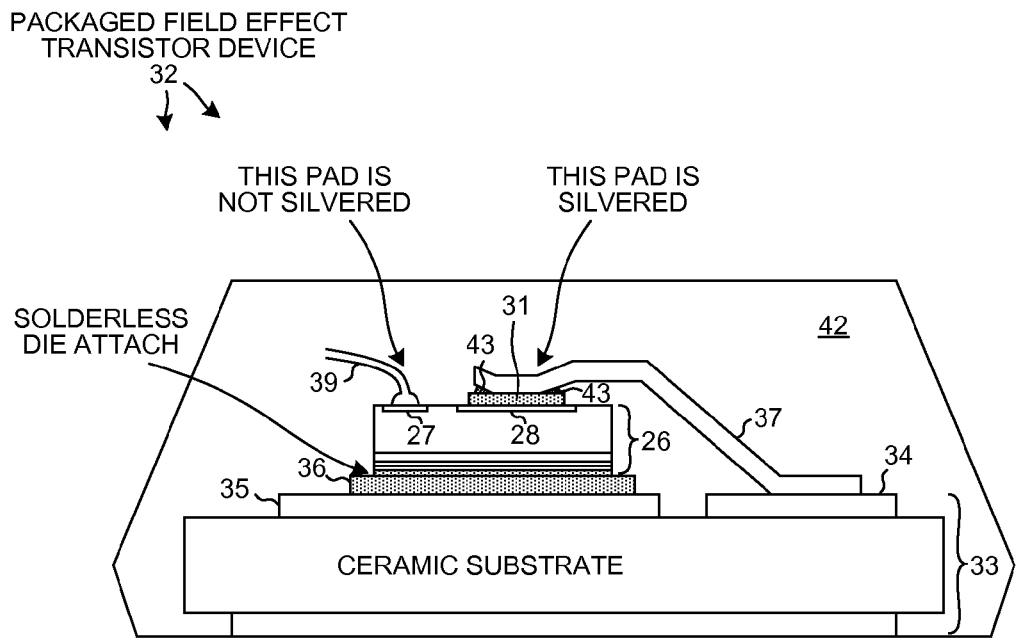
FIG. 14 is a cross-sectional side view of the packaged power field effect transistor device of FIG. 13.

FIG. 14 is a cross-sectional side view of packaged power field effect transistor device 32. Reference numeral 42 identifies the injection molded plastic of the package. Reference numeral 43 identifies soft solder that attaches the clip 37 to sintered silver structure 31.

Figure 15:
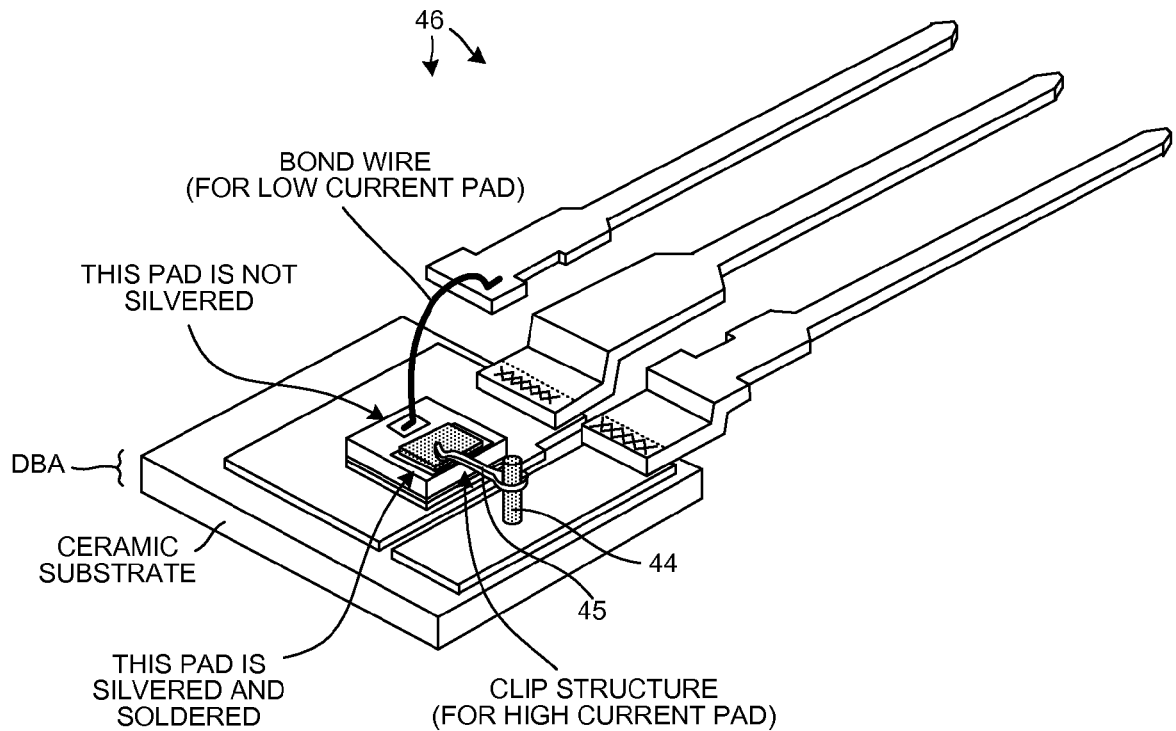
FIG. 15 is a simplified perspective view of a packaged power field effect transistor device that employs another style of clip in accordance with another novel aspect.

FIG. 15 is a simplified perspective view of a packaged power field effect transistor device 46 (encapsulant not shown) similar to the packaged power field effect transistor device 32 of FIG. 13, except that the packaged power field effect transistor device of FIG. 15 employs a different style of clip structure. The clip structure of FIG. 15 involves a post 44 and a clip 45.

In the fabrication process described above, the silver nanoparticle paste includes flux particles that assist in penetrating the native aluminum oxide on the source electrode pad. In another example, the silver nanoparticle paste used has no such particles. Prior to deposition of each amount of silver nanoparticle paste on a pad, the native aluminum oxide on the pad is removed by blasting the pad with a stream of abrasive particles. The micro-jet head is fitted with two micro-nozzles and a vacuum nozzle for this purpose. The micro-jet head is precisely controlled to move in the X, Y and Z dimensions as is known in the micro-jetting arts. The micro-nozzle blasts the stream of abrasive particles with a suitable high velocity at the selected localized area of the aluminum source electrode pad. The vacuum nozzle is positioned to remove the spent abrasive particles and other debris after the particles have hit the aluminum surface. In this way a high velocity stream of abrasive particles mechanically blasts away the native aluminum oxide on the source electrode pads. Native aluminum oxide does not immediately regrow on the cleaned area due to the entire leadframe assembly being disposed in the oxygen-free environment. Next, an amount of silver nanoparticle paste is deposited onto the cleaned aluminum surfaces of the source pads. This deposition also occurs in the oxygen-free environment such that the leadframe assembly is not subjected to oxygen between the time of native oxide removal until after the time of deposition of the silver nanoparticle paste. All of the pads to be provided with silver nanoparticle paste may be cleaned in a first pass and then all the cleaned pads provided with amounts of silver nanoparticle paste in a second pass, or alternatively each pad to be provided with silver nanoparticle paste may be individually cleaned and then provided with paste, one by one. After the source pads have been microjetted with silver nanoparticle paste, the entire leadframe assembly is then heated to sinter the amounts of nanoparticle paste on the source pads. The remainder of the fabrication process is the same as described above with respect to the power field effect transistor device 32 of FIG. 13.

Figure 16:
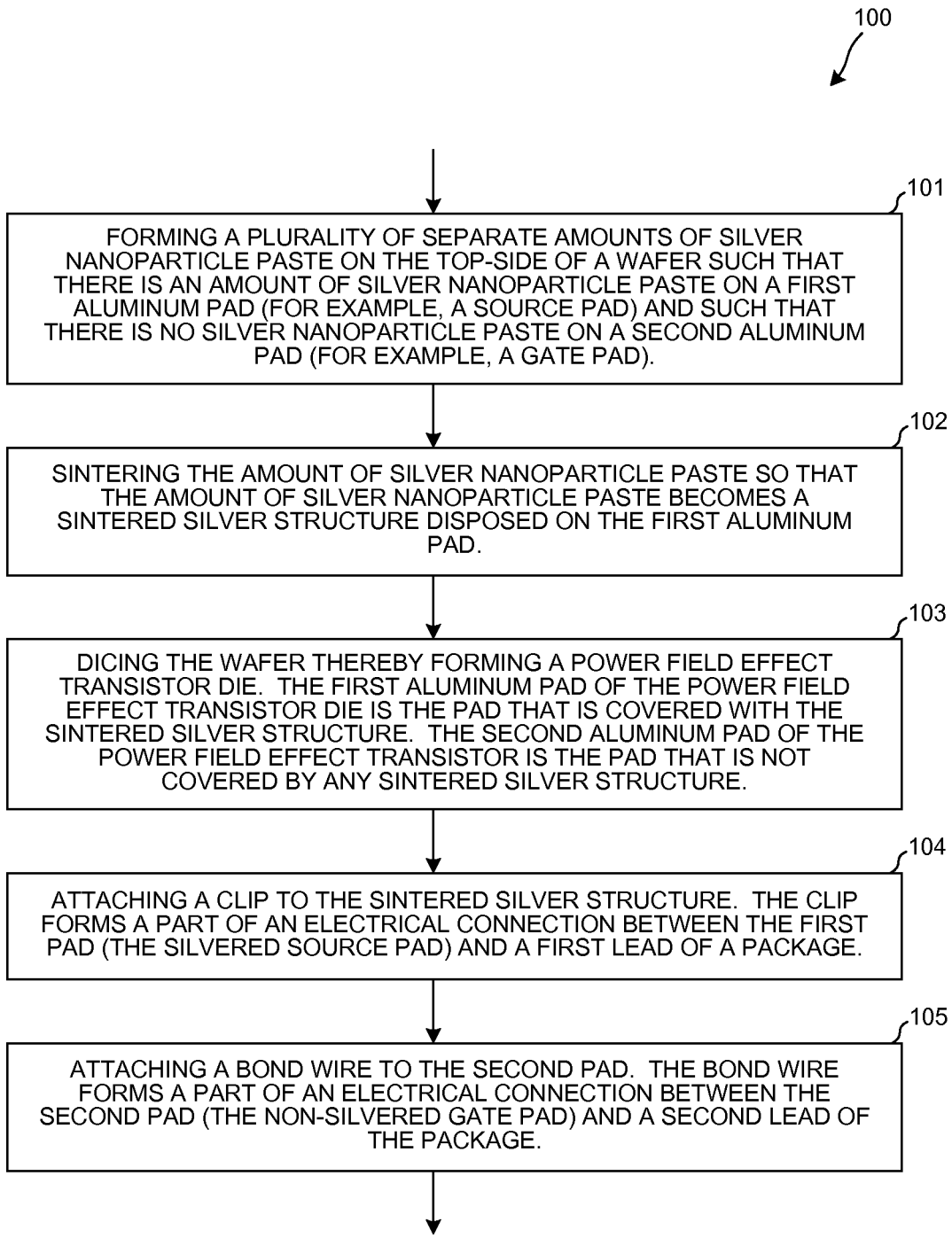
FIG. 16 is a flowchart of a method in accordance with one novel aspect.

FIG. 16 is a flowchart of a method of forming a packaged power field effect transistor device. A plurality of separate amounts of silver nanoparticle paste are formed (step 101) on the top-side of a wafer such that there is an amount of silver nanoparticle paste on a first aluminum pad (for example, a source pad) and such that there is no silver nanoparticle paste on a second aluminum pad (for example, a gate pad). The first and second aluminum pads are pads for a single discrete field effect transistor. The amount of silver nanoparticle paste is then sintered (step 102), along with many other such amounts of silver nanoparticle paste on the wafer, so that the amount of silver nanoparticle paste becomes a sintered silver structure disposed on the first aluminum pad. Next, the wafer is diced (step 103) thereby forming power field effect transistor dies. The first aluminum pad and the second aluminum pad are pads of one of the dies. The first aluminum pad is covered, at least partly, by the sintered silver structure. There is no sintered silver structure disposed on the second aluminum pad. Subsequently, in the chip assembly process, a clip is attached (step 104) to the sintered silver structure. The clip forms a part of an electrical connection between the first pad (the silvered source pad) and a first lead of a package. A bond wire is attached (step 105) by conventional ultrasonic wire bonding to the second pad. The bond wire forms a part of an electrical connection between the bond pad (the non-silvered pad) and a second lead of the package. The assembly is then overmolded with plastic encapsulant and is lead formed and lead trimmed, thereby forming the package power field effect transistor device.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
 (a) forming a plurality of separate amounts of silver nanoparticle paste on a top-side of a wafer such that there is an amount of silver nanoparticle paste on a first aluminum pad and such that there is no silver nanoparticle paste on a second aluminum pad; and
 (b) sintering the amount of silver nanoparticle paste so that the amount of silver nanoparticle paste becomes a sintered silver structure disposed on the first aluminum pad and so that the second aluminum pad is not covered by any sintered silver layer.

2. The method of claim 1, further comprising:
 (c) dicing the wafer into a plurality of dice, wherein one of the dice is a die that includes the first aluminum pad that is covered with the sintered silver structure and the second aluminum pad that is not covered by any sintered silver structure.

3. The method of claim 2, further comprising:
 (d) attaching a clip to the sintered silver structure on the first pad; and
 (e) attaching a bond wire to the second pad.

4. The method of claim 2, further comprising:
 (d) using solder to attach a clip to the sintered silver structure of the first pad.

5. The method of claim 2, further comprising:
 (d) attaching a back-side of the die to a Direct Bonded Aluminum (DBA) substrate with a solderless silver-to-silver bond.

6. The method of claim 1, wherein there is no non-aluminum metal layer disposed between the first aluminum pad and the amount of silver nanoparticle paste during the forming of (a), and wherein there is no non-aluminum metal layer disposed on the second aluminum pad during the forming of (a).

7. The method of claim 2, wherein said one of the dice is a power field effect transistor device.

8. The method of claim 1, wherein (a) involves microjetting the plurality of separate amounts of silver nanoparticle paste onto source electrode pads on the top-side of the wafer.

9. The method of claim 1, wherein (a) involves:
 (a1) directing a stream of abrasive particles at the first aluminum pad thereby removing a layer of native aluminum oxide from the first aluminum pad; and
 (a2) after the removal of the layer of native aluminum oxide of (a1) then microjetting the amount of silver nanoparticle paste onto the first aluminum pad.

10. The method of claim 1, wherein the silver nanoparticle paste includes flux particles.

11. A method comprising:
 (a) microjetting silver nanoparticle paste onto a source electrode pad on a top-side of a wafer that includes the source electrode pad and a gate electrode pad, wherein the microjetting is performed such that there is silver nanoparticle paste on the source electrode pad and such that there is no silver nanoparticle paste on the gate electrode pad; and
 (b) sintering the silver nanoparticle paste so that the silver nanoparticle paste becomes a sintered silver structure disposed on the source electrode pad and so that the gate electrode pad is not covered by any sintered silver layer.

12. The method of claim 11, wherein the source electrode pad and the gate electrode pad are part of a power field effect transistor device.

13. The method of claim 11, further comprising:
 (c) dicing the wafer into a plurality of dice, wherein one of the dice is a die that includes the source electrode pad and the gate electrode pad.

14. The method of claim 13, further comprising:
 (d) attaching a back-side of the die to a Direct Bonded Aluminum (DBA) substrate with a solderless silver-to-silver bond.

15. The method of claim 11, further comprising:
 (c) attaching a clip to the sintered silver structure on the source electrode pad; and
 (d) attaching a bond wire to the gate electrode pad.

16. The method of claim 11, further comprising:
 (c) using solder to attach a clip to the sintered silver structure.

17. The method of claim 11, wherein there is no non-aluminum metal layer disposed between the source electrode pad and the amount of silver nanoparticle paste during the microjetting of (a), and wherein there is no non-aluminum metal layer disposed on the gate electrode pad during the microjetting of (a).

18. The method of claim 11, further comprising before (a):
 (c) directing a stream of abrasive particles at the source electrode pad thereby removing a layer of native aluminum oxide from the source electrode pad.

19. The method of claim 11, wherein the silver nanoparticle paste includes flux particles.

* * * * *